(12) United States Patent
Suzuki

(10) Patent No.: US 6,321,182 B1
(45) Date of Patent: *Nov. 20, 2001

(54) METHOD AND SYSTEM FOR PREDICTING A SIGNAL GENERATED IN SIGNAL PROCESSING APPARATUS

(75) Inventor: Takashi Suzuki, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/621,978

(22) Filed: Mar. 26, 1996

(30) Foreign Application Priority Data

Mar. 27, 1995 (JP) .................................... 7-068042

(51) Int. Cl.[7] .................................... G06F 17/50
(52) U.S. Cl. .............................................. 703/14
(58) Field of Search .................... 364/524, 527; 385/24, 46; 703/14

(56) References Cited

U.S. PATENT DOCUMENTS

| 4,370,711 | * | 1/1983 | Smith ..................................... 364/200 |
| 5,289,551 | * | 2/1994 | Nakama et al. ........................ 385/45 |
| 5,570,442 | * | 10/1996 | Arii et al. ............................... 385/46 |
| 5,684,899 | * | 11/1997 | Ota ......................................... 385/24 |
| 5,696,955 | * | 12/1997 | Goddard et al. ...................... 395/563 |
| 5,729,517 | * | 3/1998 | Fujiwara et al. ....................... 369/59 |

* cited by examiner

Primary Examiner—M. Kemper
(74) Attorney, Agent, or Firm—Fitzpatrick, Cella, Harper & Scinto

(57) ABSTRACT

A signal pattern representing a signal formed by quanta discretely distributed on a time base is generated. One of a plurality of destination circuits for branching is allocated to each of quanta within the generated signal pattern so that the ratio of the numbers of quanta in the plurality of destination circuits equals a predetermined branching ratio. A signal pattern representing a signal to be input to each of the destination circuits is generated assuming that each quantum enters only an allocated destination circuit. Thus, a result of processing of a signal processing apparatus for processing a signal formed by a very small number of quanta is predicted.

16 Claims, 12 Drawing Sheets

METHOD AND SYSTEM FOR PREDICTING A SIGNAL GENERATED IN SIGNAL PROCESSING APPARATUS

BACKGROUND OF THE INVENTION

1. Field of the Invention

This invention relates to a signal processing apparatus, and to a method for predicting the result of processing of the apparatus, and more particularly, to a signal processing apparatus for processing a signal formed by very small number of quanta, and to a method for predicting the result of processing of the apparatus.

2. Description of the Related Art

In conventional information processing apparatuses, information is represented by a signal having a continuous waveform, and the signal is processed by various elements. At that time, an input signal branches, in some cases, into a plurality of signals if necessary, and each of the signals branched is processed by the element in branch circuit.

In the current area of multimedia, when receiving and transmitting high-quality image information on an information communication network, the amount of information to be processed in unit time greatly increases at a terminal device of the network. Accordingly, the degree of integration of devices for processing the information more and more increases, and the line width of signal processing circuits becomes narrower. Parallel processing of information will be more frequently performed.

In such a case, the intensity of a signal transmitted through a circuit becomes weaker, and the signal cannot be represented by a continuous waveform as in the conventional apparatuses, but is formed by respective quanta which are discretely distributed on the time base, as a quantum-pulse-train signal shown in FIG. 6. In FIG. 6, each region surrounded by broken lines represents a signal with a rectangular waveform, and each pulse indicated by a solid line represents a quantum. In order to perform signal processing, a quantum circuit which divides such a quantum-pulse-train signal into two signals will now be considered.

Usually, in the stage of designing a quantum circuit used under various circumstances, even when an element to which a signal after branching is input generates quantum noise, in order to check if the element has a sufficient function, it is necessary to know the quantum-pulse-train signal to be input to the element.

The lowest limit of the intensity of a signal for which a circuit incorporating such signal processing elements works well becomes reference when determining an input signal intensity for using an apparatus incorporating the circuit with high reliability, and supply of a signal having an intensity more than necessary can be thereby avoided. Hence, this knowledge concerning the lowest limit of the signal intensity is very important also from the viewpoint of energy saving.

In conventional techniques, however, when a quantum-pulse train shown in FIG. 6 enters a branching point, it is impossible to predict each signal of quantum-pulse train which should be enter into each branch circuit. This is because according to conventional quantum mechanics, when a quanta enters a branch point, it is prohibited to consider that the quanta enters certain one of branch circuits.

That is, according to Dirac, when a photon is incident upon an interferometer, it must be considered that a single photon is divided into two components into which the photon enters (see P. A. M. Dirac "The principles of Quantum Mechanics" (Oxford University Press, London, 1985) 4th ed., pp. 7–9). This indicates that the concept that the photon enters only a certain one of the components is invalid. The same holds true also for other quanta than a photon.

SUMMARY OF THE INVENTION

It is an object of the present invention to provide a signal processing apparatus for processing a quantum-pulse-train signal while causing it to branch with a predetermined branching ratio.

It is another object of the present invention to provide a method for predicting quantum-pulse signals obtained after branching at a branch point of a quantum circuit, and an apparatus which adopts such a method.

It is still another object of the present invention to provide a method for evaluating the function of a signal processing element for processing a quantum-pulse-train signal, and an apparatus which adopts such a method.

It is yet another object of the present invention to provide a method for evaluating the intensity of a signal necessary for causing a quantum circuit for processing a quantum-pulse-train signal to operate, and an apparatus which adopts such a method.

According to one aspect, the present invention which achieves these objectives relates to a signal processing apparatus comprising input means for inputting a signal formed by quanta discretely distributed on a time base, and branch means for causing the signal input from the input means to branch into a plurality of signals formed by quanta discretely distributed on the time base. Said branch means causes each of the quanta of the input signal to branch as a quantum of one of the signals after branching so that the ratio of the numbers of quanta in the respective signals after branching equals a predetermined branching ratio.

According to another aspect, the present invention which achieves these objectives relates to a method for predicting a result of processing by a signal processing apparatus for causing a signal formed by quanta discretely distributed on a time base to branch into a plurality of destination locations, the method comprising the steps of generating an input signal pattern representing a signal to be input to the signal processing apparatus, allocating one of the destination circuits for each quantum in quantum patterns representing respective quanta in the input signal pattern generated in the generating step so that the ratio of the number of quantum patterns of the respective destination locations equals a predetermined branching ratio, and generating branched signal patterns representing signals to be output to the respective destination circuits based on the allocation in the allocating step.

Other objectives and advantages besides those discussed above shall be apparent to those skilled in the art from the description of the preferred embodiments of the invention which follow. In the description, reference is made to the accompanying drawings, which form a part thereof, and which illustrate an example of the invention. Such an example, however, is not exhaustive of the various embodiments of the invention, and therefore reference is made to the claims which follow the description for determining the scope of the invention.

DESCRIPTION OF THE PREFERRED EMBODIMENTS

A preferred embodiment of the present invention will now be described in detail with reference to the drawings.

Figure 7:
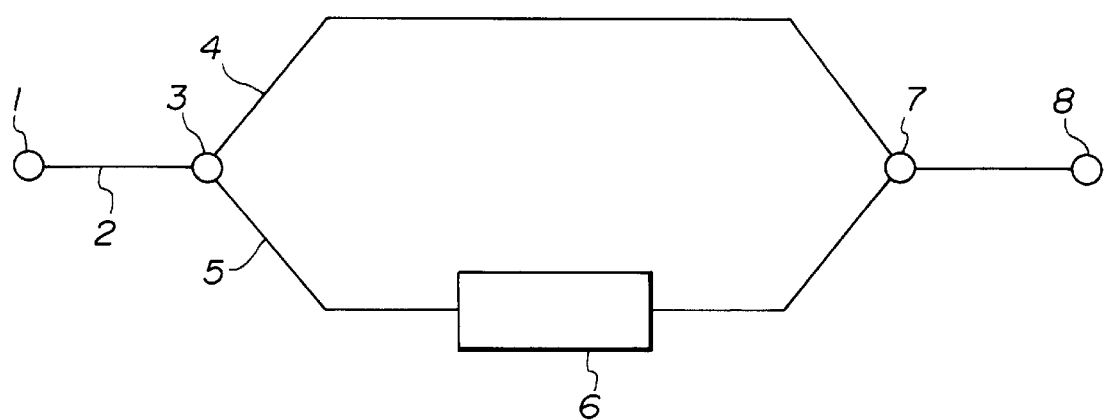
FIG. 7 is a diagram illustrating an example of the configuration of a quantum circuit having a branch point.
Figure 8:
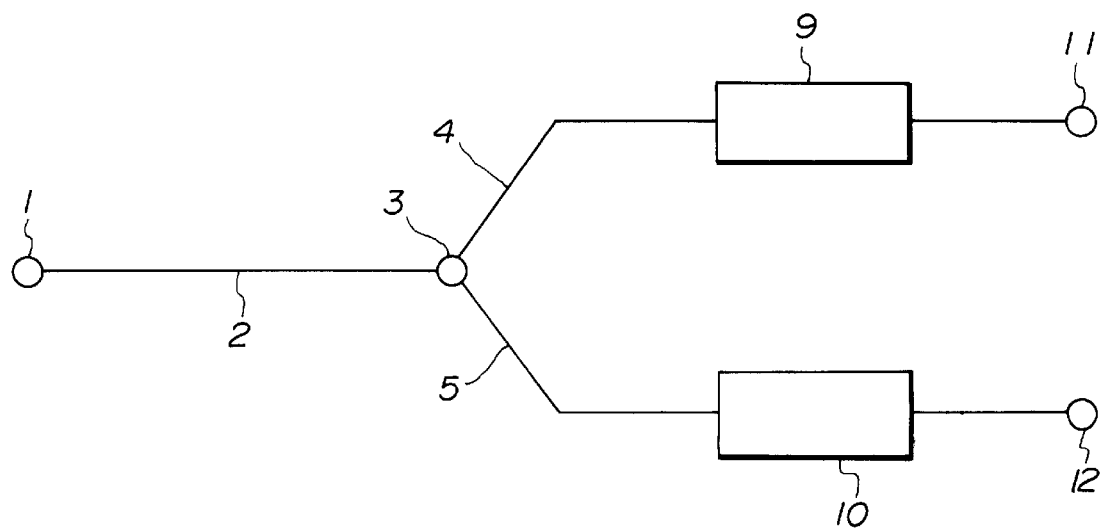
FIG. 8 is a diagram illustrating another example of the configuration of a quantum circuit having a branch point.

FIGS. 7 and 8 illustrate quantum circuits for dividing a quantum-pulse-train signal into two signals in order to perform signal processing.

FIG. 7 illustrates a circuit for checking autocorrelation of a quantum-pulse-train signal. The signal is input to the quantum circuit shown in FIG. 7. The quantum circuit shown in FIG. 7 includes a signal input terminal 1, a signal input circuit 2, a branch point 3 for the signal, branch circuits 4 and 5, a delay element 6, a confluence 7 for signals from the branch points 4 and 5, and an output terminal 8.

FIG. 8 illustrates a circuit for causing a signal to branch into two circuits in order to perform parallel processing. The circuit shown in FIG. 8 includes a signal input terminal 1, a signal input circuit 2, a branch point 3, branch circuits 4 and 5, signal processing elements 9 and 10, and output terminals 11 and 12. The signal processing element 9 performs some kind of processing for an input signal from the branch circuit 4. The signal processing element 10 performs some kind of processing for an input signal from the branch circuit 5. Signals after the processing by the signal processing elements 9 and 10 are output from the output terminals 11 and 12, respectively.

In FIG. 7, if a single quantum input to the branch point 3 can be allocated to one of the branch circuits 4 and 5, various methods for allocating the signal may be considered. However, the principle of quantum mechanics prohibits such allocation. In quantum mechanics, theoretically serious paradoxes, such as the Shrödinger's cat paradox and the EPR (Einstein-Podolsky-Rosen) paradox, have also been known.

The inventor of the present invention has solved such problems in quantum mechanics, and has reconstructed a clearer theory. As a result, it has been clarified that the conclusion of conventional quantum mechanics of prohibiting the above-described method of allocation is wrong, and, to the contrary, this method is quite right in correctly revised quantum mechanics. Since this point is the theoretical backing for the present invention, a description will now be provided for introducing the correctly revised quantum mechanics.

The subject of the present invention relates to the spatiotemporal behavior of each quantum, such as a photon, an electron and the like, or in other words, to wave-particle duality possessed by such quantum.

As usual ways dealing with the wave-particle duality of the quanta, interference of a Dirac particle of spin of 1/2 applying a Young's double slit interferometer will now be studied. In the exact opposite of usual thought experiment of this kind, a system, in which the Young's double slit interferometer performs runs with a constant velocity toward a group of Dirac particles at rest that are randomly distributed with sufficient distance separation from one another will be analyzed using relativistic quantum mechanics.

Figure 9:
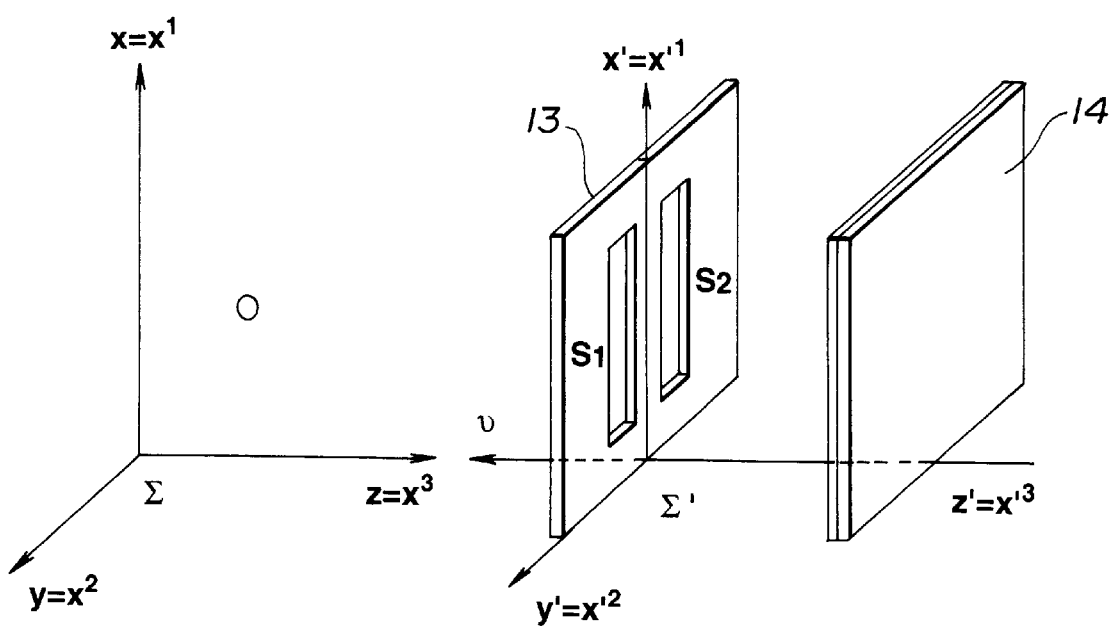
FIGS. 9 and 10 are diagrams illustrating an apparatus used for thought experiments.

FIG. 9 illustrates an apparatus used in this thought experiment. The three Cartesian components of the position vector in each inertial system $\Sigma$ or $\Sigma'$ are represented by $(x,y,z)$ or $(x',y',z')$, respectively. Similarly, four-dimensional position vectors $x^\mu$ and $x^{\mu'}$ in the respective inertial systems are represented by $(x^0 \equiv ct, x^1, x^2, x^3)$ and $(x^{10} \equiv ct, x^{11}, x^{12}, x^{13})$. $\Sigma'$ moves toward $\Sigma$ in the direction of $-z$ ($=-x^3$) with a constant velocity of $\upsilon$. It is assumed that the Young's double-slit interferometer, comprising a screen 13 having two slits $s_1$ and $s_2$, and an emulsion plate 14 sufficiently separated from the screen 13 compared with the separation of the slits, is fixed on the moving coordinate system $\Sigma'$. The Dirac particles incident upon the $\Sigma'$ one after another blocked by the screen 13, or pass through the slits to be absorbed by the emulsion plate 14. In this procedure, it is assumed that, after one particle has been absorbed by the emulsion plate 14, the next particle is incident upon the screen 13.

The phenomena of interference in the above-described thought experiment are divided into two processes, i.e., a process in which each of the Dirac particles is incident upon the screen 13, and a process in which the incident Dirac particle passes through the slits to be absorbed by the emulsion plate 14. The former process can be approximately described mathematically by applying one of the methods for solving a free Dirac equation in the sense that any boundary condition is provided on the screen 13. The free Dirac equation in $\Sigma$ is expressed as follows (see W. Greiner, "Relativistic Quantum Mechanics" (Springer-Verlag, Berlin, Heidelgerg, 1990) p. 127).

$$[\gamma^\mu \partial/\partial x^\mu + i(mc/\hbar)]\psi = 0, \quad (1)$$

where $\gamma^\mu$ is a 4×4 matrix whose components are Pauli matrices, m is a rest mass, c is the light velocity, $\hbar$ is the Planck's constant multiplied by $\frac{1}{2\pi}$, and $\psi$ is the wave function to be obtained. This equation has the following solution for a particle at rest having the rest-energy $E_0 = mc^2$:

$$\psi(x) = u \exp(-iE_0 t/\hbar), \quad (2)$$

where u is a spinor. In particular, full attention must be paid to the fact that equation (2) does not depend on any space coordinates. This point will be discussed later. This wave function is transformed into the following wave function in $\Sigma'$:

$$\psi'(x') = L(-\upsilon)\psi(\Lambda^{-1}(-\upsilon)x') = ((-\upsilon)u \exp[(-i/\hbar)(E't' - p'^3 x'^3)], \quad (3)$$

where $L(-\upsilon)$ is the proper Lorentz transformation for a spinor from $\Sigma$ to $\Sigma'$, $\Lambda^{-1}(-\upsilon)$ is the inverse matrix of a similar Lorentz transformation for a four-dimensional position vector, and $p'^3$ is the fourth component of the four-momentum. In the case of a Dirac particle with positive energy, by substituting $E'=mc^2/\sqrt{1-\beta^2}$, and $p'^3=m/\sqrt{1-\beta^2}$ with $\beta=\upsilon/c$ into equation (3), the following expression is obtained:

$$\psi'(x')=L(-\upsilon)u \exp i(k'^3 x'^3-\omega' t'), \quad (4)$$

where $k'^3 \equiv 2\pi/\lambda'=m\upsilon/(\hbar\sqrt{1-\beta^2})$ and $\omega' \equiv 2\pi\nu=mc^2/(\hbar\sqrt{1-\beta^2})$. Equation (4) represents a plane wave propagating positive direction having a wavelength of $$\lambda'=h\sqrt{1-\beta^2}/(m\upsilon), \quad (5)$$

and having a phase velocity $v'ph=\lambda'_\nu$ expressed by $$\upsilon'ph=c^2/\upsilon>c>\upsilon. \quad (6)$$

These values coincide exactly with the values of the wavelength and the phase velocity of the de Broglie wave. Thus, it becomes clear that the relativistic wave function of a Dirac particle is equivalent to the de Bloglie wave.

Klein-Gorden equation for a free particle of spin 0 (see "Relativistic Quantum Mechanics" cited before) is expressed:

$$(\Box+m^2c^2/\hbar^2)\psi=0, \quad (7)$$

where $\Box$ is D'Alembertian. Equation (7) has a solution similar to equation (2) for a particle at rest and a solution representing a deBroglie wave similar to the equation (4).

As for a photon of spin 1, when E and p of relation $E^2=c^2p^2$ are quantized, regarding them as operators applied to potential $A_\mu$ of electromagnetic field, the following expression is obtained:

$$\Box A_\mu=0 \quad (8)$$

(see G. Takeda and H. Miyazawa, "Principles of Elementary Particles" (Syokabo, Tokyo, 1965) p.83 (in Japanese)). This equation formally coincides with the classical wave function for vector potential A of electromagnetic field. A solution of (8) representing a single plane wave is written as $$A_\mu(\chi)=\alpha_\mu\exp i(\kappa\cdot\tau-\omega t), \quad (9)$$

where $\alpha_\mu$ is a vector related to both wave number vector $\kappa$ of a photon and one of the two eigenstates with respect to the polarization of the photon.

In the case of photons, however, it is usual to make another quantization regarding $A_\mu$ itself as an operator. From the requirement that the law of motion of photons should be covariant to the Lorentz transformation, quantized electromagnetic field potential $A_\mu(x)$ must also satisfy equation (8) (see the above-mentioned reference, p. 95). Such potential is generally expressed by making quantization of electromagnetic field potentials produced by quantum mechanical harmonic oscillators within a cubic region of free space of side L as $$A_\mu(x)=\frac{1}{\sqrt{L^3}}\sum_k\sum_h\sqrt{\frac{c\hbar}{2k}}\{a^\dagger(k,h)\varepsilon^*_\mu(k,h)\exp-i(k\cdot r-\omega t)+$$

-continued $$a(k,h)\varepsilon_\mu(k,h)\exp i(k\cdot r-\omega t)\},$$

where $\alpha^\dagger(\kappa,h)$ and $\alpha(\kappa,h)$ are the creation and annihilation operators, respectively, and $\epsilon_\mu$ is a unit vector related to both $\kappa$ and polarization or helicity h, each of which has two eigenvalues (see the above-described reference, p. 96). In the above-equation, summation over $\kappa$ can be converted to an integration (see R. Loudon, "The Quantum Theory of Light" (Clarendon Press, Oxford, 1983) 2nd ed., Chap. 4, Secs. 4.5 and 4.6, pp. 135 and 138).

In the present application, however, the step of quantization for photons is kept to the same stage as that of other particles, the wave function associated with a single photon is expressed in free space by a single plane wave, equation (9), similarly to other free particles. This is because, if the number of particles were changed in free space in which no external field exists, it directly contradicts the law of conservation of energy and will never happen even if the particles are photons.

It goes without saying that equation (9) cannot be obtained by applying the thought experiment shown in FIG. 9 to a photon, which does not have a rest-energy but has only kinetic energy $E=cp$. This is because, if a photon with a frequency $\nu$ emitted by a light source is observed in an inertial system which goes away with velocity $\upsilon$ from the light source, it is readily proved that $$\lim_{\nu'\to c}(\nu'/\nu)=0$$

by applying the Doppler effect, where $\nu'$ is a frequency of the photon in the moving system. That is, the photon cannot exist by itself in an inertial system which departs from the light source with the velocity of light, c, and therefore the wave function (2) for a particle at rest does not exist for a photon.

Thus, it can be considered that there is no basic difference between a photon and other particles in their motion in a free space, except that a photon cannot be at rest and is always moving with constant velocity c in an arbitrary intertial system. Actually, in the interference experiment with Young's double slit arrangement, there is entirely no difference between photons (see Y. Tsuchiya, E. Inuzuka, M. Sugiyama, T. Kurono, and C. Horiguchi, J. of ITJ, 36, 1010 (1982) (in Japanese); H. Takahashi, S. Aoshima, T. Urakami, T. Takemori, I. Hirano, and Y. Tsuchiya, KOGAKU (Jpn. J. Opt.), 20, 108 (1992) (in Japanese)) and electrons (see A. Tonomura, J. Endo, T. Matsuda, T. Kawasaki, and H. Ezawa, Am. J. Phys, 57, 117 (1989)) in the procedure in which, with the lapse of time, interference fringes are gradually produced as a density distribution of their positions on the observation plane where they have been localized one after another. According to the above-described experimental ground, the solution of equation (8) for each photon is also expressed by a single plane wave equation (9), as in the case of each electron.

The process of deriving a de Bloglie's phase wave expressed by equation (4) will now be considered. According to special relativity, an elementary particle is defined as a dimensionless geometrical point (see L. Landau and E. Lifsitz, "The Classical Theory of Field", trans. M. Hamermesh (Addison-Wesley, Cambridge, Mass., 1951) p. 25). That is, a relativistic elementary particle has a structure of a point in which a rest mass or rest energy is concentrated. Hence, this particle must exist, in principle, as a point in space irrespective of whether it is observed or not. Of course, such a concept of the particle strongly conflicts with the concept of particles in quantum mechanics based on the probabilistic interpretation of the wave function.

In this respect, however, the fact that the Dirac equation derived along with the requirement that it must be covariant to the Lorentz transformation could predict the existence of positrons can be considered to suggest that the Lorentz transformation is applicable even in such a local space as small as the size of a positron. In other words, although the probabilistic interpretation is merely an interpretation, the concept that an elementary particle is a geometrical point may be regarded as one of axioms which one of the fundamental frameworks relativistic quantum mechanics, viz., the Lorentz transformation demands. Of course, since the particle motion is quantized, the concept of a classical particle, which simultaneously possesses its exact position and, as is cannot be an axiom.

The basic axioms on a wave and a particle in relativistic quantum mechanics will now be derived. The justification of the theoretical scheme involving these axions depends, as Dirac (see "Quantum Mechanics" cited before, p. 15) stated, apart from internal consistency, on whether or not final results derived from the theory agree with experiments.

Returning to the concept of an elementary particle being a geometrical point, an arbitrary particle can be considered in general as a composite particle consisted of these relativistic elementary particles, and therefore will form a core of an extremely small region in which a mass is concentrated. Such a small region including a point in which a rest mass or a rest-energy of a relativistic elementary particle concentrates will be generally designated as a core. Accordingly, in principle, the core of a particle is localized in a space irrespective of whether the particle is observed or not.

Equation (1) corresponds to a relativistic equation of motion of the core of such a Dirac particle. Wave function (2) being a solution of equation (1) and representing a particle at rest is expressed by an (amplitude factor)×(phase factor), which is designated as the phase of a particle. The phase is independent of spatial coordinates and depends only on time. It is apparent that this time dependency comes from rest-energy Eo of the particle. Namely, the origin of the phase is this rest-energy. Moreover, since equation (2) is a solution of equation (1) without any boundary condition, the phase everywhere in the whole space periodically changes with a frequency determined by the rest-energy of the particle and synchronously varies in one united body without any time lag. It is apparent that the time dependency of a de Broglie wave is due to this time dependency of the phase.

Next, the cause of space dependency of the de Broglie wave will be studied. Grossly speaking, the phase at an observation point within $\Sigma'$ travelling with a constant velocity toward a particle at rest is, naturally, a function of the space and time coordinates. The exact form of the function is determined through Lorentz transformation of phase (2) resulting in equation (3) or (4). Thus, the dependency of the de Broglie wave on space coordinates is caused by the relative motion with a constant velocity between the particle and its observation point.

The most important conclusion obtained by the above-described unconventional thought experiment is that an effective source of a de Broglie wave is this relative motion. The results obtained with respect to a de Broglie wave accompanied by a particle subject to a relativistic wave equation will now be described as axioms.

W-1) The wave function associated with a free particle is a phase wave and coincides with the de Broglie wave when the particle has a rest mass.

W-2) The effective source of the phase wave is a relative motion with a finite constant velocity $\upsilon$ between the particle and its observation point.

W-3) The real source of the phase wave is the rest-energy ($E_0=mc^2$) of the particle.

The conclusion shown in W-2) indicates that no matter how far the observation point is from the core of the particle, the phase wave is generated at the position exactly when the relative motion betwee the core and the observation point occurs. By considering the reverse process of the generation of the phase wave, it can be easily understood that the extinction of the phase wave occurs at the moment when the relative motion ceases.

To date, it has been impossible to rationally explain a sudden collapse of the wave function accompanied by the detection of each particle. According to the above-described studies, however, the detection of a particle indicates the extinction of the relative motion of the particle in a free space, which is the effective source of a phase wave. Accordingly, the phase wave naturally disappears from the free space at the moment when the particle is detected. The above-described studies indicate the following causality:

W-4) There exists distinct causality between the instantaneous generation or collapse of a phase wave and the beginning or termination of relative motion, which is equivalent to the generation or collapse of the effective source.

The generation of classical waves is caused only by their sources, and is independent of the existence of an observation point. In sharp contrast, the following three elements, i.e., the rest-energy of a particle for a real source, an observation point, and a relative motion between them, are indispensable for the generation of a phase wave.

As described above in detail, although entirely different from the concept of classical waves, as seen in the axioms W-2)–W4), a phase wave provided physical sources and causality on generation and collapse of oneself is evidently a real physical wave.

Furthermore, the above-described discussion indicates that the phase wave is a physical reality even if it is expressed by a complex function. In fact, as seen in the phenomenon of interference, we can observe the phase difference between two phase waves when they are superposed. This is because the phase difference is converted into an observable quantity representing the spatial distribution of the number of particles. In this way, if the phase difference can be considered as a physical reality.

Referring again to the phase expressed by equation (2), if a de Broglie's phase wave has a physical reality, the phase itself expressed by equation (2), which is the origin of the phase wave, must naturally be a physical reality.

As already mentioned, the phase of a Dirac particle or the like occupies the entire space around the core, and the whole phase space changes only with time in the manner of one united body. The frequency of the change and an initial phase, though it is not explicitly expressed in equation (2), are proper to the particle. As seen in the mechanism of generating the phase wave shown in W-2), every position in the phase space of the particle should be physically equivalent in the sense that the distance between the observation point and the core (rest-energy) of the particle is irrlevant to this mechanism.

These facts indicate that the phase is not a physical entity independent of the particle, but rather a part of the particle.

Accordingly, the size of a free particle including the phase space equals the size of the entire space. The amplitude factor of the phase naturally determines the spatial characteristics of the phase space of the particle.

We have previously mentioned that an elementary particle being a geometrical point can be an axiom in our theoretical scheme. However, as indicated above, this describes only a part of an elementary particle. Two axioms with respect to a particle will now be shown.

P-1) A free particle consists of two parts, i.e., a small core in which the mass (energy) of particle is concentrated, and a phase space which occupies the whole space around the core.

P-2) The amplitude factor of the phase space determines the spatial characteristics (scalar, vector, tensor and the like) of the particle.

In classical mechanics, a particle is regarded as a massive point in a space. The presence of the phase space for a part of the particle, not only indicates the difference in the structure from a classical particle, but also can rationally and rather naturally explain the curious behavior of the particle which is beyond our imagination when regarding the particle as a massive point.

By combining the axioms W-1)–W-4) and P-1)–P-2, which are the basic axioms concerning the wave-like property and the particle-like property of a free particle, it can be understood that the phase wave is a wave which is generated and propagated in the phase space which is inside the particle itself. That is, an individual particle can have both of the so-called complete particle property and complete wave property.

It can be understood that the above-described axioms can also be applied to a photon except for W-3) which is based on a rest mass or a rest-energy. However, the real source of the phase wave is not a rest mass, but is a rest-energy, i.e., energy itself. Hence, it can be supposed that a photon also has a core in which energy is concentrated. Furthermore, a photon has an effective source, which is a relative motion having a constant velocity c with respect to an arbitrary coordinate system.

Accordingly, it can be concluded that an individual photon has the complete particle property and wave property. Although to be described in detail later, if a particle has the structure shown by P-1), the interference phenomenon of an individual particle with itself can be much more rationally and easily explained than by the conventional probabilistic interpretation.

Thus, it has been elucidated that relativistic quantum mechanics itself provides mechanisms to endow the wave function with physical reality. The mechanisms suggest a method for giving a similar physical reality to the wave function in ordinary quantum mechanics, that is, adding a term of rest-energy to the Schrödinger's equation. In fact, Dirac has already shown a clue for a concrete approach to such formulation (see "The principles of Quantum Mechanics" cited before, pp. 118–121).

When the velocity of a particle is sufficiently small, since momentum of the particle can be expressed like $p \ll mc$, relativistic Hamiltonian $H = mc^2 \sqrt{1 + p^2/(mc)^2}$ can be approximated to:

$$H \approx mc^2 + p^2/(2m). \tag{10}$$

Using this approximate Hamiltonian, the following non-relativistically approximated Schrödinger's equation (revised Schrödinger's equation, hereafter) is obtained:

$$\{\hbar^2/(2m)\nabla^2 - E_0 + (i\hbar\partial/\partial t)\}\psi = 0. \tag{11}$$

It is possible to prove that this equation has the following solution for a particle at rest:

$$\psi = C \exp(-iE_0 t/\hbar^2), \tag{12}$$

and the following solution representing a plane wave propagating in the positive z direction:

$$\psi = C \exp\{i(kz - \omega t)\}. \tag{13}$$

In above equations, C is a complex amplitude, $$k = 2\pi/\lambda = mv/\hbar,$$

where $\lambda$ is the de Broglie wavelength, and $$\omega = 2\pi\nu \approx (mc^2/\hbar)(1 + \beta^2/2) \approx (mc^2/\hbar),$$

where $\nu$ is the frequency.

Equation (13) can also be derived by applying approximate Lorentz transformation (see "The Classical Theory of Field" cited before, p. 13) to equation (12), and this transformation differs from Galileo transformation only in transformation of time coordinates. Thus, the phase velocity of the plane wave represented by equation (13) becomes:

$$v_{ph} \approx c^2/(v), \tag{14}$$

which approximately coincides with the phase velocity (see equation (16)) of the de Broglie wave shown in equation (4). That is, it can be concluded that the solution of revised Schrödinger's equation (11) is also a de Broglie wave.

In this regard, the phase velocity of the wave function satisfying the conventional Schrödinger's equation has been $v/2$, which is entirely different from the phase velocity of the de Broglie wave. As for the wavelength of the de Broglie wave, it is possible to continuously transform from relativistic quantum mechanics to nonrelativistic one by an operation of $\beta \to 0$. The foregoing result indicates that discontinuity of the above transition remained in the phase velocity has disappeared.

The Schrödinger's equation can be applicable to arbitrary particles regardless of bosons or fermions as long as they have rest mass. Hence, according to the foregoing results, the above-described axioms W-1)–W-4) and P-1)–P-2) for particles and de Broglie waves thereof subject to the relativistic wave equations can be generally made axioms for arbitrary particles and de Broglie waves thereof. Consequently, it can be said that the foregoing results of theoretical studies have clearly proven that an arbitrary free particle having a finite mass and moving even with a small velocity has coexistent duality associated with a real de Broglie wave.

The clue for driving equation (11) has, as already mentioned, been suggested by Dirac. Actually, however, the constant term $mc^2$ in Hamiltonian (10) has been deleted from the reason that it has no influence on the equation of motion of a particle. As a result, the ordinary Schrödinger's equation has been derived. However, as indicated by the foregoing results of studies, erasing the term of rest-energy in the basic equation (11) in quantum mechanics is equivalent to entirely eliminating the following, namely, the wave function for a particle at rest, sources for a de Broglie wave, and causalities on generation and collapse of the wave function from the theoretical scheme. Therefore, it turns out to be impossible from the beginning to construct internally consistent theory as long as the conventional Schrödinger's equation is placed at the foundations of the theory.

As described above, by carrying out an alteration of the formalism such that the rest-energy term of a particle is added to the Schrödinger's equation, revised Schrödinger's equation (11) has been obtained. As a result, reality can be theoretically provided for the wave function. Once the reality of the wave function is realized, this reality urges another revolution of the fundamental formalism of quantum mechanics.

In conventional quantum mechanics, it is understood that the wave function $\psi$ represents the "state" of a system to be dealt with. Furthermore, it is generally understood that the system can simultaneously have a plurality of different basic "states". The mathematical basis for such argumentation lies in the linearity of the Schrödinger's equation and, therefore, in the validity of the principle of superposition of states. Although the constant coefficient term is added, revised Schrödinger's equation (11) is still linear, and the principle of superposition is available. In the following, it will be shown in what concrete system, for example, the superposition of two wave functions $\psi_1$ and $\psi_2$ satisfying equation (11) is valid even when these wave functions turn out real physical waves.

Figure 10:
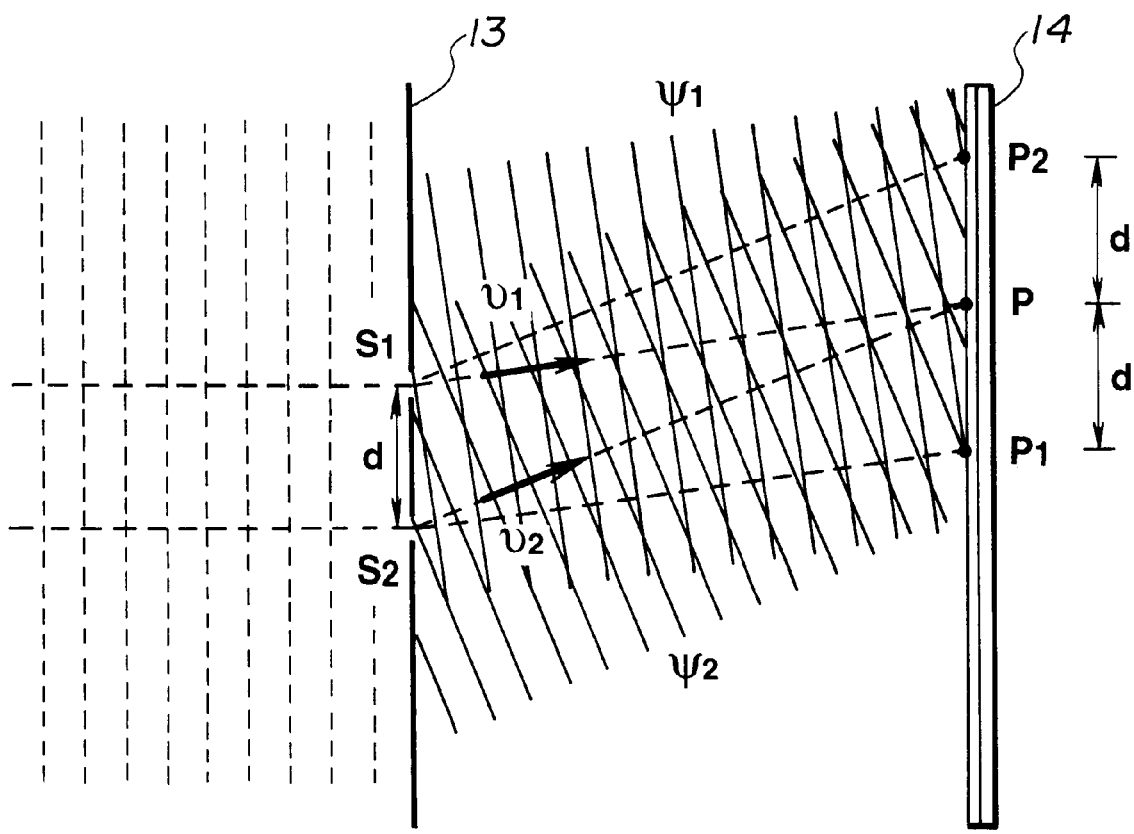

For the purpose of mathematically describing the second half stage of the thought experiment of interference phenomena, Young's interferometer in inertial system $\Sigma$ is illustrated again in FIG. 10. Here, the interferometer is at rest, and each particle runs toward the interferometer according to revised Schrödinger's equation (11). It is also supposed that the core of a particle has already passed through one of the slits $s_1$ and $s_2$, and travels toward a point P on emulsion plate 14.

The de Broglie wave in the phase space of the particle passes through the two slits before the core will do. When only the de Broglie wave has passed through the slits $s_1$ and $s_2$ in advance, the de Broglie wave should be diffracted by the slits and will emit in the form of two cylindrical waves. The fundamental mechanisms of producing these cylindrical waves and of their causing interference of each single particle with itself will be clarified in detail bellow. Provided the core has already passed through the slits and makes a constant velocity motion with; velocity $\upsilon$, the de Broglie wave associated with the core should be a plane wave according to the axiom W-1). Then, the core will proceed along either one of the paths $\overline{s_1P}$ and $\overline{s_2P}$. The velocity vectors of the core travelling along either one of the paths are denoted by $\upsilon_1(|\upsilon_1|=\upsilon)$ or $\upsilon_2(|\upsilon_2|=\upsilon)$, respectively.

Here, it is assumed, for a while, that, as in the first half stage of this thought experiment, the particle is at rest and the observation system runs toward the core. If the core of the particle is at rest on path $\overline{s_1P}$, observation point P is regarded as being fixed on observation coordinate system $\Sigma_1'$ which moves toward the core with the velocity of $-\upsilon_1$. If the core is at rest on path $\overline{s_2P}$, the observation point is regarded as being fixed to observation coordinate system $\Sigma_2'$ which runs toward it with velocity $-\upsilon_2$. Accordingly, regardless of which slit the core has passed through, the point P must simultaneously accomplish the same functions as functions accomplished by the following two points, i.e., $P_1'$ on $\Sigma'$ travelling with velocity vector $-\upsilon_1$, and $P_2'$. on $\Sigma_2'$ travelling with velocity $-\upsilon_2$. This indicates that the system comprising the core and point P is equivalent to the combination of the two different systems, i.e., the system comprising the core and point $P_1'$, and the system comprising the core and point $P_2'$. Thus, according to axioms W-1) and W-2), two de Broglie's plane phase waves turn out to simultaneously propagated toward points $P_1'$ and $P_2'$ within $\Sigma_1'$ and $\Sigma_2'$, respectively.

Returning again to the conventional standpoint, in which the core moves, the above-described situation is replaced as follows; a single core travelling along one of the paths is observed at a single observation point P which refers to two different coordinate systems. Accordingly, two de Broglie's plane waves propagate in the interferometer, and studies must be made for each case in which the core passes through slit $s_1$ or $s_2$. Let $\alpha$ be the separation of the slits. Then, in FIG. 10, two points are newly settled on plane 14, i.e., $P_2$ with distance $\alpha$ above the P and $P_1$ with distance $\alpha$ below P. When the core passes through slit $s_1$, the following pair of plane waves corresponding to two cores travelling from slit $s_1$ toward points P and $P_2$ are generated:

$$\psi_1 = C_1 \exp i[\kappa_1 \cdot (\tau_1 - \tau_{s_1}) - \omega t + \delta_1]$$
$$\psi_2 = C_2 \exp i[\kappa_2 \cdot (\tau_2 - \tau_{s_1}) - \omega t + \delta_2], \qquad (15)$$

where $\kappa_1 = m\upsilon_1/\hbar$, $\kappa_2 = m\upsilon_2/\hbar$, $\tau_1$ and $\tau_2'$ are position vectors of arbitrary points on paths $\overline{s_1P}$ and $\overline{s_1P_2}$, respectively, $\tau_{s_1}$ is the position vector of the slit $s_1$, and $\delta_1$ and $\delta_2$ are initial phases. In this case, since the source of these waves is identical it holds $\delta_1 = \delta_2$. In addition, since the widths of the two slits are the same, $C_1 = C_2$ holds for these coefficients. On the other hand, when the core passes through slit $s_2$, a pair of plane waves corresponding to the cores travelling towards points $P_1$ and P are generated as follows:

$$\psi_1 = C_1 \exp i[\kappa_1 \cdot (\tau_1 - \tau_{s_2}) - \omega t + \delta_1]$$
$$\psi_2 = C_2 \exp i[\kappa_2 \cdot (\tau_2 - \tau_{s_2}) - \omega t + \delta_2], \qquad (16)$$

where $\tau_1'$ and $\tau_2$ are the position vectors of arbitrary points on paths $\overline{s_2P_1}$ and $\overline{s_2P}$, respectively, and $\tau_{s_2}$ is the position vector of slit $s_2$. However, in either case of Eqs. (15) and (16), since the phase difference between the two phase waves at point P is the same, both of the pair wave can be expressed in an unified form by $$\psi_1 = C_1 \exp i[\kappa_1 \cdot (\tau_1 - \tau_{s_1}) - \omega t + \delta_1]$$
$$\psi_2 = C_2 \exp i[\kappa_2 \cdot (\tau_2 - \tau_{s_2}) - \omega t + \delta_2]. \qquad (17)$$

In this way, an interference at observation point P is caused by the above pair waves.

In more practical expression, the interference between the pair waves in equation (17) at P will depend only on two rays travelling along two paths $\overline{s_1P}$ and $\overline{s_2P}$ toward P perpendicularly to the wavefronts of waves $\psi_1$ and $\psi_2$, respectively.

The next core entering in the interferometer will travel toward some other point on observation plane 14 accompanied by a pair of de Broglie's plane waves similar to those shown in Eq. (17), in other words, accompanied by a pair of rays. Accordingly, since such similar event of each individual particle is repeated in an infinite number of times, an infinite number of rays will fan out from each single point on each slits toward observation plane 14. Investigating the above processes from somewhat different viewpoint, they themselves reveal an extremely important fact that, since every point on observation plane 14 always refers to a pair of different observation coordinate systems, a pair of an infinite number of rays associated with each single core simultaneously are emitted from the slits toward the observation plane irrespective of whether the relevant core has passed through the slits or not.

After all, by integrating each of the infinite number of rays emitted from each slit, a pair of cylindrical waves $\psi_{c1}$ and $\psi_{c2}$ will be obtained. Recalling that each of the rays corresponds to a plane wave, this is considered as a reflection of the fact that an arbitrary wavefront can be composed by superposing appropriate plane waves travelling in different directions (see, for example, J. W. Goodman, "Introduction of Fourier Optics" (McGRAW HILL, New York, 1968) Sec. 3–7, p. 48). Hence, even previous to passing of each core through the slits, two cylindrical waves exist in the interferometer and, after the passage, the core travels toward the observation plane accompanied by a pair of the cylindrical waves. However, each cylindrical wave does not have the identical amplitude across the entire wavefront but, in the present experiment, the amplitude will be determined by calculating Fraunhofer diffraction integral when a plane wave with a de Broglie wavelength impinges on each slit.

On the observation plane, These cylindrical waves associated with the same single core are superimposed and naturally occur an interference expressed by $$\psi_c = \frac{1}{\sqrt{2}}(\psi_{c_1} + \psi_{c_2}), \quad (18)$$

and $$|\psi_c|^2 = \frac{1}{2}[|\psi_{c_1}|^2 + |\psi_{c_2}|^2 + \langle \psi_{c_1}|\psi_{c_2}\rangle + \langle \psi_{c_2}|\psi_{c_1}\rangle]. \quad (19)$$

Whenever the core of a particle is detected, no matter how small the value of $|\psi_c(P)|^2$ should be, the one entire core will be necessarily detected at point P as long as the value is not zero and, at the instance of the detection, two de Broglie waves collapse according to axiom W-4). As shown above in detail, it has been ascertained that each individual particle interferes with itself based on its own dual structure. Although similar cylindrical waves can be solutions of Shrodinger's equation, since these waves have nothing of characteristics which de Broglie waves have, they cannot be physical waves.

It we make much account of physical form of Schrödinger's equation, it might be regarded as describing a motion of a particle that has only kinetic energy without any rest mass like a photon, though such viewpoint rather make dissociation from an actual system increase. Hence, it seems more reasonable than that to define the equation such that, since the number of particles in a system described by the equation is uncertain, it represents a motion of a classical wave involving an infinite number of particles like a classical electromagnetic wave. For example, we can define cylindrical wave functions $\Psi_{c_1}$ and $\Psi_{c_2}$ associated with an infinite number of particles, the spatial part of which coincide with those of de Broglie waves $\Psi_{c_1}$ and $\Psi_{c_2}$, respectively. Then, these waves will produce interference fringes expressed by $$\psi_c = \frac{1}{\sqrt{2}}(\psi_{c_1} + \psi_{c_2}), \quad (20)$$

and $$|\Psi_c|^2 = \frac{1}{2}[|\Psi_{c_1}|^2 + |\Psi_{c_2}|^2 + \langle\Psi_{c_1}|\Psi_{c_2}\rangle + \langle\Psi_{c_2}|\Psi_{c_1}\rangle]. \quad (21)$$

Different from Eq. (17), this equation (21) represents interference fringes as they are which have been produced by the infinite number of particles and have recorded on emulsion plate 14.

On observation plane 14, let $\chi$ be the coordinate axis determined perpendicularly to the slits on screen 13, and by normalizing as $$\int_{-\infty}^{\infty}|\psi_c|^2 dx = 1,$$

it has been conventionally interpreted that Eq. (20) represents interference phenomenon of a single particle with itself. However, as is apparent from the foregoing discussions, this understanding is invalid. Instead, such normalization should be considered to attribute $|\Psi_c|^2$ the meaning of a probability density distribution per particle making it irrelevant to the number of particles concerned in interference phenomena. Hence, let N be the number of particles which will be used in the experiment, the number of particles to be found out at point P can be predicted by N $|\Psi_c(P)|^2$. It follows that $|\Psi_c|^2$ can be designated as a probability density distribution as it has been.

Given above, wave function $\Psi_c$ can be defined as a probability wave function per particle. Then, a single normalized particle accompanied by a probability plane wave impinging on the slits will pass through each of the two slits with the probability of ½ in complete agreement with the conventional concept of a particle associated with a probability wave. Thus, it is concluded that the conventional quantum theory is convenient to predict the result of whole phenomena composed of an infinitely large number of events but is unable to physically describe each individual event.

As is apparent from the foregoing description, as far as a particle in free motion consists of a core and a phase wave, there is no difference between photons and electrons in the detailed mechanism of producing interference fringes as a result of integrating interference of each particle with itself. That is, although our novel thought experiment shown in FIG. 9 cannot be directly applied to photons, when describing the motion of a particle in a coordinate system fixed on an observation apparatus as in the case of FIG. 10, since any arbitrary particle including a photon can be represented by a plane phase wave in free space according to axiom W-1), it is unnecessary to discriminate photons from electrons in the mechanism of interference phenomena.

The above fact has been clearly shown, as already mentioned by citing the literatures, in the experiments for photons and for electrons carried out applying a Young's interferometer having the same configuration as that used in our experiment. This complete agreement between the theory and the experiment concerning the universality that the concrete mechanism of interference phenomena does not depend on the type of particles confirms the viewpoint that Eq. (8) is the quantum-mechanical wave equation for each photon and Eq. (9) is a quantum-mechanical wave function representing a single-photon state.

Dirac obtained the conclusion that each individual photon interferes only with itself based on the law of conservation of energy. On the other hand, according to the above-described studies, since a particle has the dual structure indicated by the axiom P-1), although the core of the particle cannot but pass through only one of two slits, phase waves generated in the entire phase space of the particle can pass through the both slits enabling the particle to interfere with itself through the interference between its own phase waves. In principle, regardless of how far the two slits, $s_1$ and $s_2$, are placed each other, since the phase of each particle, i.e., the phase wave, is extended to the entire space, interference fringes as a result of integrating the phonemena of interference by each individual particle are formed on the observation plane 14 which is sufficiently separated from the slits compared with their separation.

The above-described studies involve contents which should be called another great revolution in the formalism of quantum mechanics. That is, when applying the principle of superposition to an object system, conditions which must be satisfied by the system exist. Normally, by generalizing the superposition of two de Broglie waves described with reference to FIG. 10, the following expression holds: "When a single particle is observed at a point which moves relative to the particle with a constant velocity and is fixed to n independent observation coordinate systems, there exist n independent phase waves having effective sources of their relative motions, and all of the phase waves can be superimposed at the observation point". This is the "theorem of superposition of phase waves" based on revised Schrödinger's equation.

The meaning that two coordinate systems are independent indicates that the relative velocity vectors for the same particle to be observed in each coordinate system substantially differ from each other. For example, this is apparent if $\upsilon_1 \neq \upsilon_2$ for two velocity vectors $\upsilon_1$ and $\upsilon_2$. However, even if $\upsilon_1 = \upsilon_2$, if two different de Broglie waves can exist, it must be considered that two different coordinate systems are present. This corresponds to the case that when superimposing two waves in an interferometer, the propagation vectors of the two waves are identical.

According to this theorem, when observing a single particle in a single observation coordinate system in a free space, only one phase wave can exist, and it is not permitted to apply the theorem of superposition to such a system. When we let a particle correspond to a cat and let a phase wave correspond to the "state" of the cat, it can be understood that the so-called Schrödinger's cat paradox does not exist in quantum mechanics based on equation (11). It is also evident that representing a particle in free space by a wave packet contradicts this theorem.

Next, some studies will be made with respect to quantum mechanics for many-particle systems. The many-particle system in this description indicates a group of many free particles of the same type which have no interactions with each other. Accordingly, the revises Schrödinger's equation (11) is applicable to each of these particles. However, it goes without saying that, even if these equations are merely summed (up), a resultant equation will not provide any novel law in physics. Similarly, the "theorem of superposition of phase waves" should be strictly applied to each individual particle.

Einstein et al., who doubted whether quantum mechanics completely describes physical reality, proposed a thought experiment which leads to a result called EPR paradox later.

Then, their proposal suggested the existence of "hidden variables" which should completely describe quantum phonomena. Although Bohr rejected the doubt of Einstein et al. according to the uncertainty principle, he had to admit that "nonlocal correlations" or, in other words, "correlations at-a-distance" exists between two particles which should be free from any interaction. Bell showed an inequality for experimentally determining whether or not such "hidden variables" should exist. However, because experimental results obtained hitherto have contradicted this inequality, it seems that the results support the validity of conventional quantum mechanics, accordingly, the existence of nonlocal correlations. This paradox will now be shown in accordance with Bohm's thought experiment.

A two-atom molecule with the total spin 0 is separated into two individual atoms by same process that does not change the total angular momentum. It is assumed that the two atoms have mutually antiparallel spins of $\hbar/2$ and $-\hbar/2$. If the two spin wave functions are represented by $u_+$ with spin $\hbar/2$ and $u_-$ with spin $-\hbar/2$, the wave functions representing the "states" of the spins of these two atoms are expressed by $\psi_c = u_+(1)u_-(2)$ and $\psi_d = u_-(1)u_+(2)$. Arguments (1) and (2) are numbers given to the respective atoms. Then, at the positions where the two atoms are far away from each other, each component of the spin, $\sigma_z$, of the atom is simultaneously measured using a Stern-Gerlach apparatus. After passing through a magnetic field, the wave function representing the system comprising the two particles sufficiently left therefrom is expressed by $$\psi = 1/\sqrt{2}(\psi_c e^{i\alpha c} + \psi_d e^{i\alpha d}), \tag{22}$$

where $e^{i\alpha c}$ and $e^{i\alpha d}$ are uncontrollable phase factors given to wave functions $\psi_c$ and $\psi_d$, respectively.

At the moment when the value of $\sigma_z$ of particle 1 is measured as positive, the value of $\sigma_z$ of particle 2 becomes negative whether or not particle 2 is observed. On the other hand, as soon as the value of $\sigma_z$ of particle 1 is observed as negative, the value of $\sigma_z$ of particle 2 becomes positive. This correlation between these two particles which originally should be free from any interaction is so-called nonlocal correlation. The "state" represented by the wave function expressed by equation (22) is called a "mixed state". Briefly speaking, this state is obtained by superposing two different "mixed states" which may be possessed by the spins of a two-particle system.

However, according to the result of the above-described studies, $u_+(1)$ and $u_-(1)$ cannot be simultaneous solutions for one revised Schrodinger's equation. In addition, each observation system in these experiments is not construded by superposing two independent observation systems. Hence, the principle of superposition can be in any way impossible to apply to the system. That is, nonlocal correlations turn out to be artifacts without any physical ground which naturally occur as a result of making such a system exist that is actually impossible to exist.

According to the studies of the present invention, before two particles are observed, two de-Broglie waves exist within each observation system. If the position vector is denoted by $\tau$, the propagation vectors of the de Broglie waves travelling in opposite directions are denoted by $\kappa$ and $-\kappa$, and the initial phases of respective waves are denoted by $\delta_1$ and $\delta_2$, the wave function representing the system is expressed by either one of the following equations, and not by both of them:

$$\psi_{+-} = u_+(1)e^{i(\kappa \cdot \tau - \omega t + \delta_1)} + u_-(2)e^{i(\kappa \cdot \tau - \omega t + \delta_2)} \tag{23}$$

$$\psi_{-+} = u_-(1)e^{i(\kappa \cdot \tau - \omega t + \delta_1)} + u_+(2)e^{i(\kappa \cdot \tau - \omega t + \delta_2)} \tag{24}$$

Also in this case, observation of the spins of particles provides the same results as in the conventional case of equation (22). However, in the case of equation (23) or (24), as can be understood from the expression thereof, since the de Broglie waves are real physical waves, each one travelling toward respective observation system is determined at the instance when two atoms have separated from each other. Accordingly, observed correlations are different from nonlocal correlations in the sense that they have existed before the observation.

Since the results of experiments which have been so far carried out in order to inspect the EPR paradox have contradicted the Bell's inequality, it has been generally accepted that "hidden variables" have never existed, and quantum mechanics have been justified. However, what lacks in the Schrödinger's equation is not variables but a constant of the rest-energy of the particle, so that the existence thereof cannot be detected by the Bell's inequality.

The above-described axioms on a wave and a particle obtained by applying the concept of elementary particles in special relativity and the relativistic wave equation for free particles to the analysis of the new thought experiment have clarified the reality of the relativistic wave function as the phase wave, and a dual structure possessed by a particle, i.e., coexistent duality of a wave and a localized particle (core). This also indicates the high degree of completion of relativistic quantum mechanics.

Based on suggestion provided by the results of the analysis, it has been shown that even in ordinary quantum mechanics for a free-particle system, a foundation exists in the revised Schrödinger's equation including the term of a rest-energy of a particle. By only adding this constant-coefficient term, not only all of the axioms concerning a wave and a particle obtained in relativistic quantum mechanics have turned out to hold, but also all of the theoretical problems and principal paradoxes in conventional quantum mechanics could have been solved. Furthermore, the interference phenomenon of an individual particle in Young's double slit interferometer which has been considered to contain mystery Feynman et al. can be rationally explained.

Also by referring to the above-described Dirac's criteria mentioned before, the new scheme of the quantum theory constructed in the above-described manner is the most justifiable theory at present. Moreover, it follows that this theory clearly supports the correctness of the method of allocating each quantum to one of branch circuits at a branch point.

Accordingly, in the quantum circuit shown in FIG. 7 or 8, a quantum incident upon the branch point 3, more precisely, the core of the quantum, enters only one of the branch circuits 4 and 5. The circuit where the quantum enters is stochastically determined.

When such circuits are electronic circuits, let $P_4$ and $P_5$ be probabilities of entrance of an electron to the branch circuits 4 and 5, $V_4$ and $Z_4$ be the potential difference and the impedance of the circuit from branch point 3 to confluent 7 or output terminal 11 via circuit 4, respectively, and $V_5$ and $Z_5$ be the potential difference and the impedance from branch point 3 to confluent 7 or output terminal 8 via circuit 5, respectively, the branching ratio is then given by $$P_4/P_5=(V_4^2/Z_4)/(V_5^2/Z_5). \tag{25}$$

Hence, each probability can be determined from above equation (25) with the help of relation $P_4+P_5=1$.

In the case of DC circuits, in expression (25), V denotes the potential difference itself, and Z denotes resistance. When these circuits are optical circuits, the ratio $P_4/P_5$ is determined by the structure and the optical characteristics of the circuits at the branch point 3 and its surrounding portion.

When conditions for making quantum circuits function, i.e., driving conditions, are determined in the above-described manner, the branching ratio is determined. By schematically generating a quantum-pulse-train signal representing quanta sequentially incident upon the branch point 3 and stochastically allocating each quantum pulse to one of the branch circuits, it is possible to make the ratio of the sums of the number of quantum pulses allocated to the respective branch circuits be substantially equal to the branching ratio.

Of course, entirely the same quantum-pulse-train signal as that which has been schematically formed after branching in the above-described manner is not formed in an actual quantum circuit. However, since instead of specific arrangement of respective quanta of the quantum pulse train, the macroscopic characteristics of the quantum pulse train are reflected on the characteristics of an actual quantum circuit, this difference is not obstacles for designing a quantum circuit.

Hence, according to this approach, signals after branching when a quantum-pulse-train signal is made to branch can be obtained in quantum circuits to be designed.

A description will now be provided for an operation of predicting the result of processing of making quantized pulses branch by a signal processing apparatus for processing quantized pulses using a computer.

Figure 11:
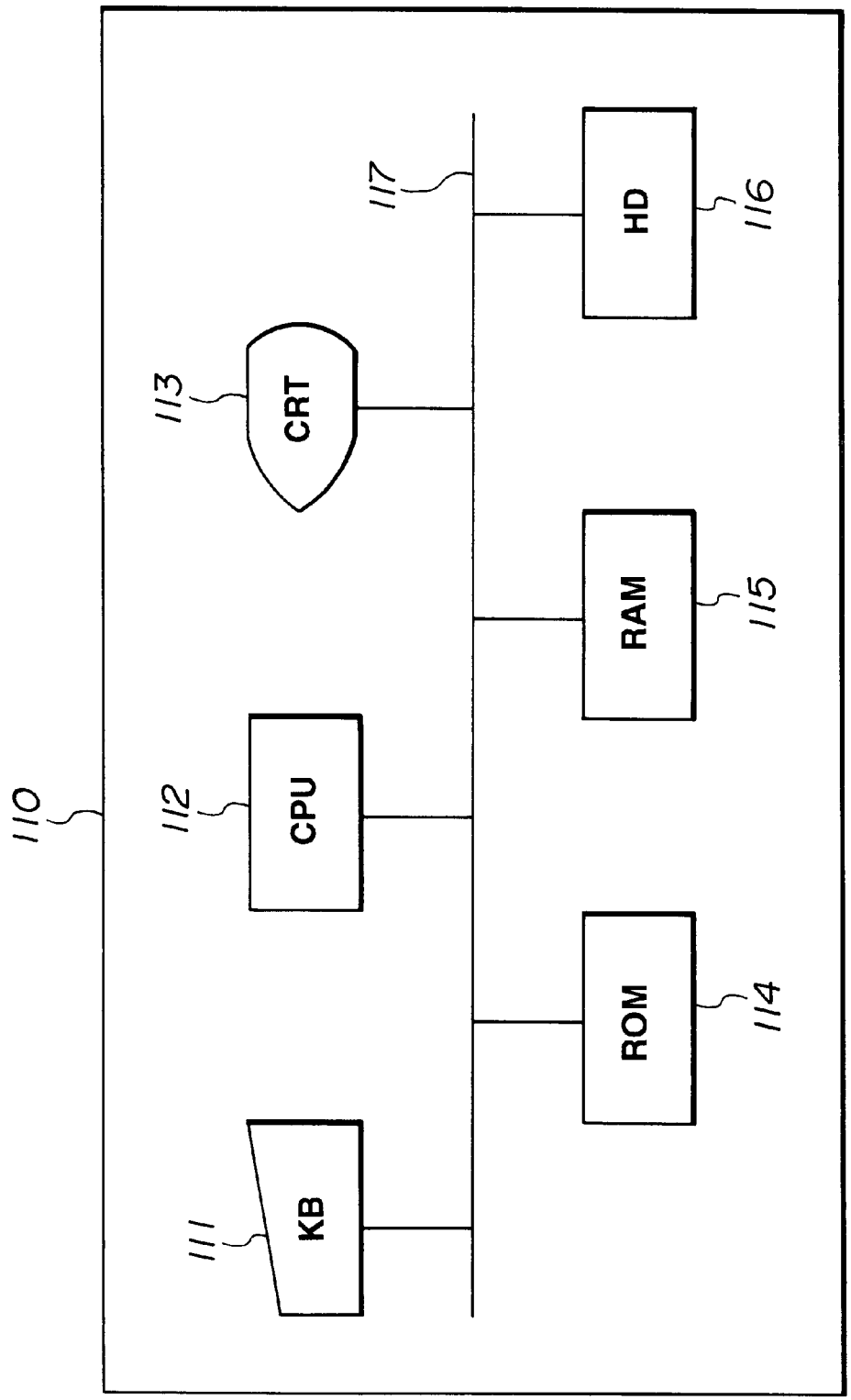
FIG. 11 is a block diagram illustrating the configuration of a computer for predicting a result of signal processing.

FIG. 11 is a block diagram illustrating the configuration of a computer 110 used for predicting the result of processing by the signal processing apparatus. An input device (KB) 111 comprises a keyboard, a mouse or the like for inputting data or commands. A central processing unit (CPU) 112 performs determination/calculation in accordance with programs stored in a ROM (read-only memory) 114 or a RAM (random access memory) 115. A display device (CRT) 113 displays the result of processing. The ROM 114 stores system programs and the like. The RAM 115 is used as working areas for the CPU 112, and stores data or programs loaded from an auxiliary storage device (HD (hard disk)) 116. The auxiliary storage device (HD) 116 comprises hard disks or the like for storing data or programs, and stores, in particular, a program corresponding to processing procedures shown in the flowcharts of FIGS. 12 and 13. A bus 117 connects the respective devices.

Figure 12:
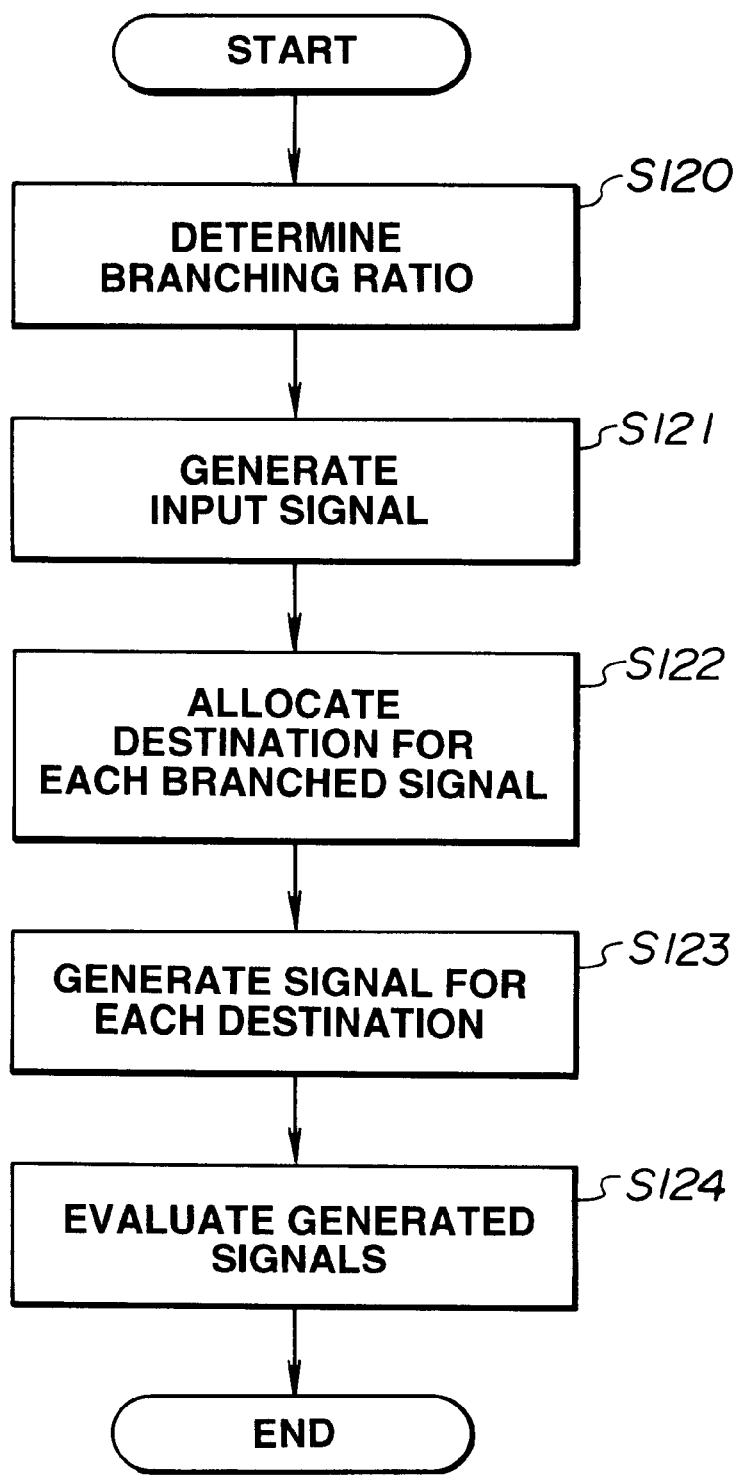
FIG. 12 is a flowchart for predicting a result of branching.
Figure 13:
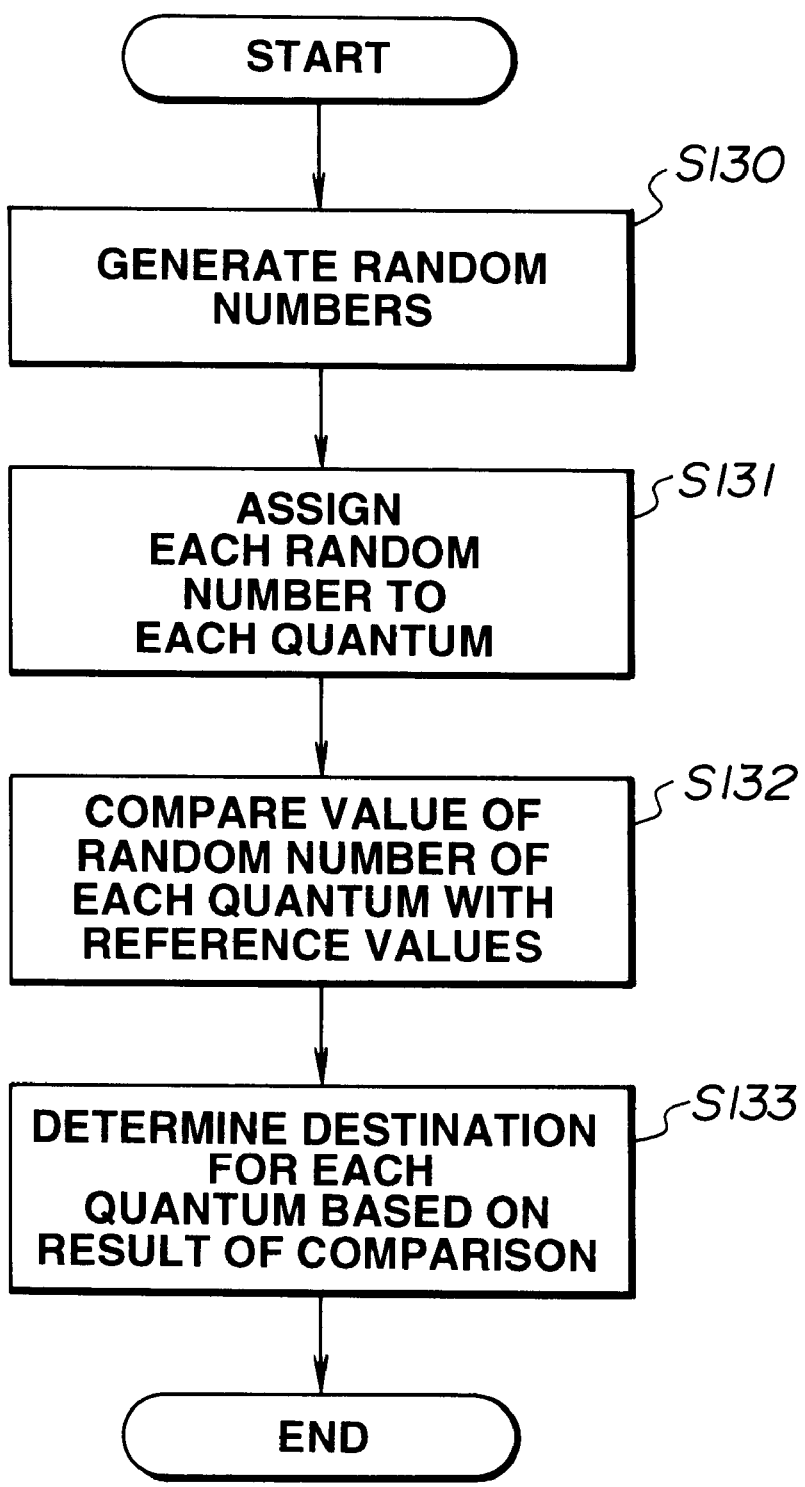
FIG. 13 is a flowchart of processing for allocating destination circuits of branching.

FIG. 12 is a flowchart illustrating processing procedures for predicting the result of branching of a quantized pulse train. A description will now be provided for an operation for predicting the result of processing of causing quantized pulses to branch by the signal processing apparatus.

First, in step S120, the branching ratio for a plurality of destination circuits of branching is determined. For that purpose, the above-described driving conditions may be input, and the branching ratio may be calculated from the driving conditions. Alternatively, a desired branching ratio may be directly input.

In step S121, a signal pattern representing a quantized pulse train to be input to the signal processing apparatus is generated.

In step S122, quantum patterns representing respective quanta in the generated signal pattern are allocated to the destination circuits so that the ratio of the numbers of quantum patterns for the respective destination circuits equals the branching ratio determined in step S120.

In step S123, by allocating the quantum patterns based on the allocation, signal patterns representing signals to be output to the respective destination circuits are generated.

The method for dealing with a quantum-pulse-train signal and signals after branching has now been shown. Hence, quantum circuits for performing desired signal processing for such a quantum-pulse-train signal can be designed. For that purpose, in step S124, the generated signals are evaluated in the following manner.

Figure 6:
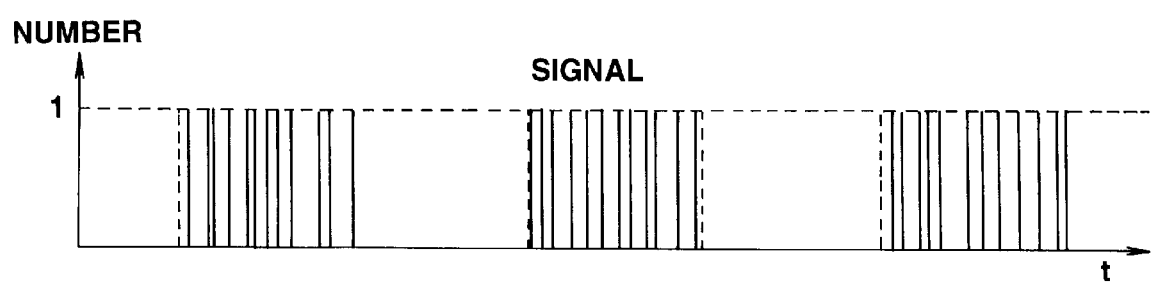
FIG. 6 is a diagram illustrating a quantum-pulse-train signal.

In FIG. 8, suppose that the signal to be input to the signal processing element 9 is, for example, the quantumpulse-train signal shown in FIG. 6. If the distribution of quantum noise from the signal processing element 9 and surrounding environment on the time base is known, the signal obtained at the output terminal 11 can be seen by adding it to the quantum-pulse-train signal. Accordingly, by referring to the signal discrimination capability of the signal processing apparatus to be connected to the terminal 11, it is possible to judge if the apparatus functions. If signal discrimination cannot be performed because the intensity of noise is relatively large in that state, the intensity of the signal to be input to the element 9 may be increased so that the number of included quanta is increased until signal discrimination is possible.

If the limit intensity of an input signal for performing signal discrimination is known, the level of an actual input signal can be set by multiplying the limit intensity by twice or more in order to increase reliability assuming the hardest environment in which the apparatus is actually used. No problem arises in view of reliability if a signal having an intensity higher than the limit intensity by the order of two digits is used. However, there is a problem from the viewpoint of the amount of energy consumption in increasing the intensity of the input signal to an unnecessary level. Hence, a signal having an intensity of less than 200 times, usually less than 20 times, i.e., the order of about one digit, is used in order to increase reliability. Thus, an apparatus having high reliability and high energy efficiency is obtained.

As described above in detail, the most important technique unique of the present invention resides in allocating a quantum-pulse-train signal incident upon a branch point to respective branch circuits. Hence, concrete methods of allocation will be described in the following embodiments.

First Embodiment

Figure 1:
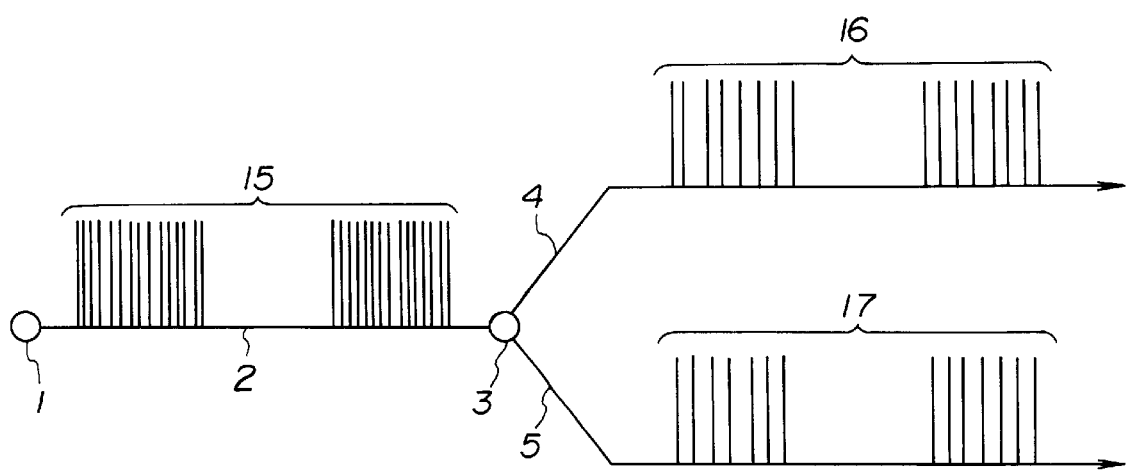
FIG. 1 is a diagram illustrating a method for forming quantum-pulse-train signals after branching according to a first embodiment of the present invention.

FIG. 1 is a schematic diagram illustrating a method of allocating a quantum-pulse-train signal according to a first embodiment of the present invention. It is assumed that a quantum-pulse-train signal 15 is transmitted on an input signal circuit 2. It is also assumed that the branching ratio of the signal at a branch point 3 of the circuit 2 equals 1, i.e., quantum pulses are allocated to each of branch circuits 4 and 5 with 50%. In this embodiment, the signal is allocated in the simplest manner. That is, odd-numbered quanta on the pulse train 15 are allocated to the branch circuit 4, and even-numbered quanta are allocated to the branch circuit 5. Thus, a quantum-pulse-train signal 16 on the branch circuit 4 and the quantum-pulse-train signal 17 on the branch circuit 5 are obtained.

Similarly, also when allocating the signal to three or more branch circuits with the same ratio, quantum-pulse-train signals on respective branch circuits are obtained by allocating quanta to the respective branch circuits cyclically with a predetermined order.

Second Embodiment

Figure 2:
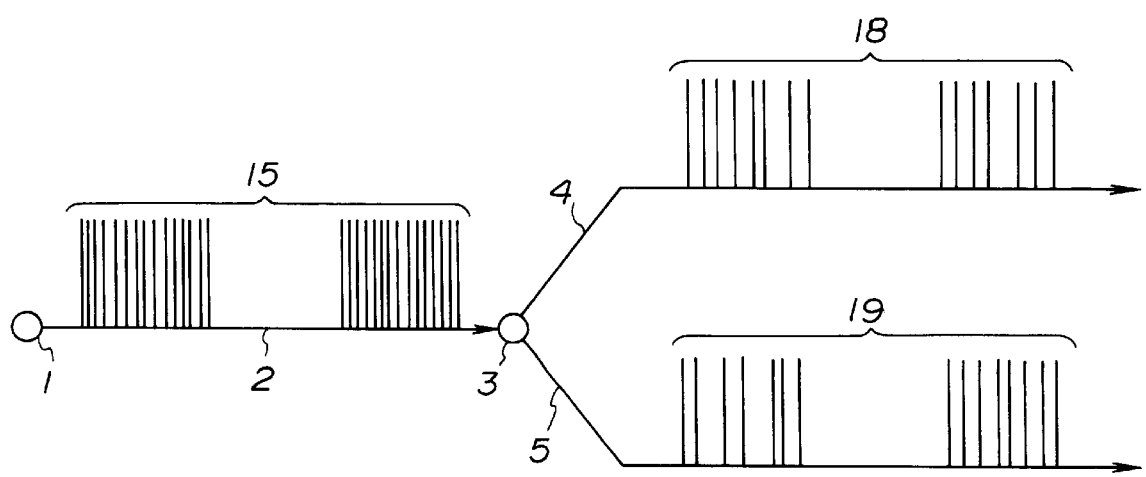
FIG. 2 is a diagram illustrating a method for forming quantum-pulse-train signals after branching according to a second embodiment of the present invention.

FIG. 2 is a schematic diagram illustrating a method of allocating a quantum-pulse-train signal according to a second embodiment of the present invention. Also in this circuit, it is assumed that the branching ratio at a branch point 3 equals 1. In contrast to the first embodiment, destination circuits of branching in step S122 in this embodiment are stochastically allocated. This method will now be described with reference to the flowchart shown in FIG. 13. First, in step S130, the computer 110 generates, for example, 8-digit random numbers having values between 0 and 1. In step S131, the respective random numbers are sequentially assigned to the corresponding pulses of an input pulse train 15. In step S132, the value of the random number of each pulse is compared with a constant 0.5. In step S133, if a random number assigned to a pulse has a value less than 0.5 as a result of the comparison, the pulse is allocated to the branch circuit 4. If a random number assigned to a pulse has a value equal to or greater than 0.5, the pulse is allocated to the branch circuit 5. Thus, quantum-pulse-train signals 18 and 19 on the respective branch circuits are obtained.

In another approach, the computer 110 may randomly generate 0 and 1, and pulses having the value 0 may be allocated to the branch circuit 4, and pulses having the value 1 may be allocated to the branch circuit 5.

Third Embodiment

Figure 3:
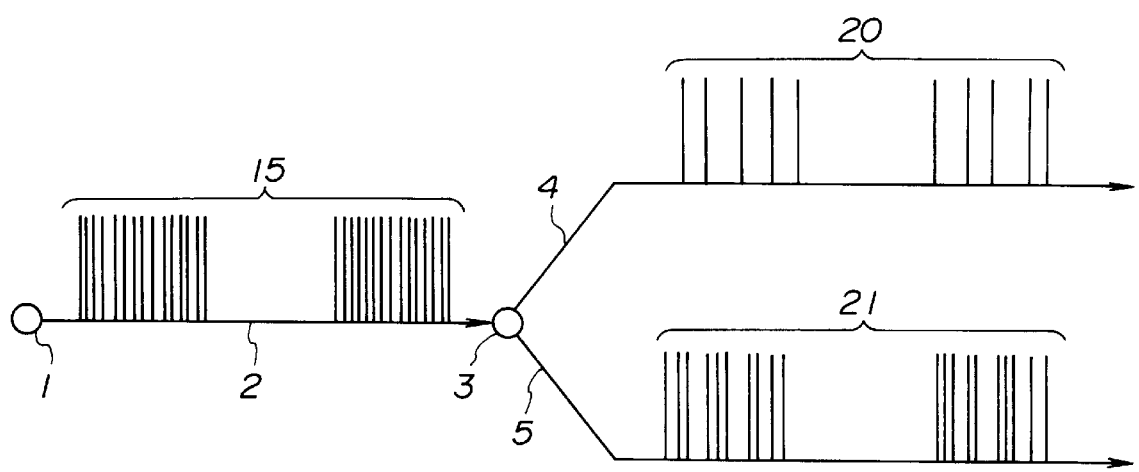
FIG. 3 is a diagram illustrating a method for forming quantum-pulse-train signals after branching according to a third embodiment of the present invention.

FIG. 3 is a schematic diagram illustrating a method of allocating a quantum-pulse-train signal according to a third embodiment of the present invention. It is assumed that the branching ratio at a branch point 3 of this circuit is 1:2. First, the computer 110 generates 8-digit random numbers having values between 0 and 1, and sequentially assigns the generated numbers to respective quanta in an input pulse train 15. Quanta having values between 0 and ⅓ from among these quanta may be allocated to a branch circuit 4, and quanta having values greater than ⅓ may be allocated to a branch circuit 5. Thus, quantum-pulse-train signals 20 and 21 on the branch circuits 4 and 5, respectively, are obtained.

Fourth Embodiment

Figure 4:
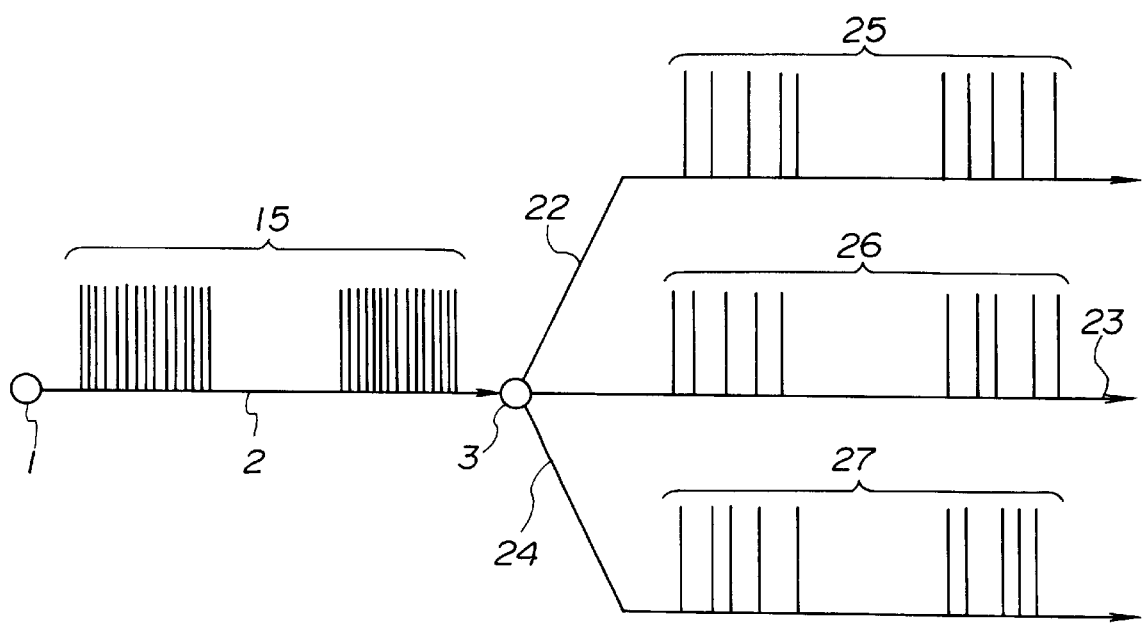
FIG. 4 is a diagram illustrating a method for forming quantum-pulse-train signals after branching according to a fourth embodiment of the present invention.
Figure 5A:
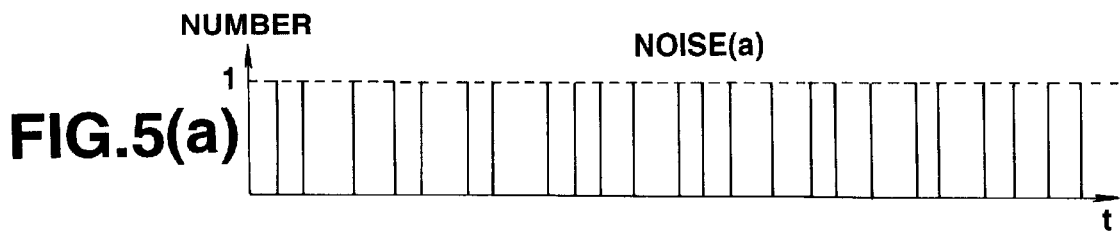
FIG. 5($a$) through 5($e$) are diagrams illustrating the relationship between generated noise and the intensity levels of processed signals in a signal processing element according to a fifth embodiment of the present invention.
Figure 5B:
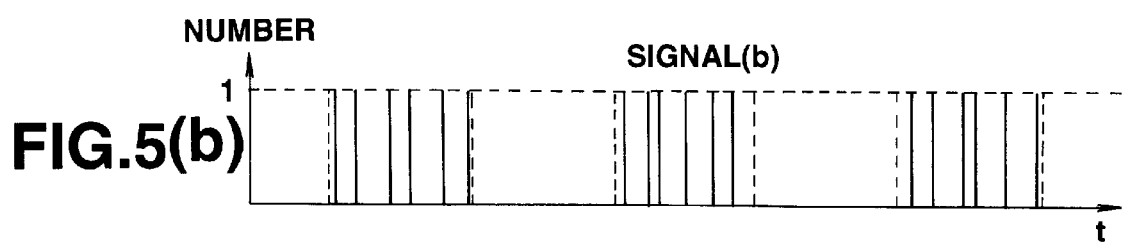
Figure 5C:
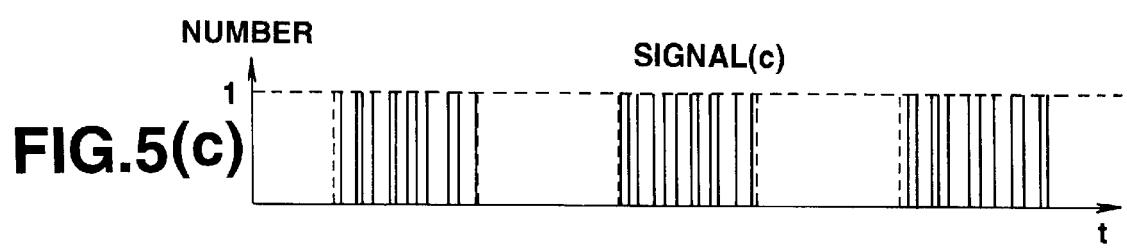
Figure 5D:
Figure 5E:

FIG. 4 is a schematic diagram illustrating a method of allocating a quantum-pulse-train signal according to a fourth embodiment of the present invention. In this quantum circuit, three branch circuits 22, 23 and 24 branch from a branching point 3. It is assumed that the branching ratio of a signal to the respective branch circuits is 1:1:1. The computer 110 generates 8-digit random numbers having values between 0 and 1, and sequentially assigns the generated random numbers to respective quanta of an input pulse train 12. Quanta having values between 0 and ⅓ from among the quanta may be allocated to the branch circuit 22, quanta having values greater than ⅓ and equal to or smaller than ⅔ may be allocated to the branch circuit 23, and remaining quanta may be allocated to the branch circuit 24. Thus, quantum-pulse-train signals 25, 26 and 27 on the respective branch circuits are obtained. Similarly, if the branching ratio is known, quantum-pulse-train signals after branching on four or more branch circuits are obtained.

Fifth Embodiment

In a fifth embodiment of the present invention, it is shown that when certain quantum noise is generated in the signal processing element 9 shown in FIG. 8, the possibility of signal discrimination of a signal processing circuit to be connected to the terminal 11 can be increased by increasing the intensity of a signal input to the element 9.

FIG. 5(*a*) illustrates quantum noise generated in the element 9. FIG. 5(*b*) illustrates a quantum-pulse-train signal after being processed by the element 9. The quantum-pulse-train signal shown in FIG. 5(*b*) indicates a limit signal capable of performing signal discrimination after the terminal 11 from a signal shown in FIG. 5(*d*) obtained by adding noise shown in FIG. 5(*a*) to the signal shown in FIG. 5(*b*). FIG. 5(*c*) illustrates a quantum-pulse-train signal after being processing by the element 9 when making the intensity of a signal input to the element 9 to be twice the intensity when the quantum-pulse-train signal shown in FIG. 5(*b*) is obtained. FIG. 5(*e*) illustrates a signal obtained by adding the noise shown in FIG. 5(*a*) to the signal shown in FIG. 5(*c*). It is apparent that the discriminating capability for the pulse train shown in FIG. 5(*e*) is higher than that for the pulse train shown in FIG. 5(*d*).

As described above, according to the foregoing embodiments, it becomes possible to predict quantum pulse signals after branching when a signal formed by quanta distributed discretely is input to the branch point of quantum circuit, though it has previously been deemed impossible in principle.

Furthermore, when performing desired signal processing for such a quantum pulse signal using a signal processing element, it becomes possible to evaluate the function of the signal processing element by providing signals having different S/N ratios.

Accordingly, in a quantum circuit comprising such signal processing elements, it becomes possible to optimize the performance, reliability and energy consumption of the quantum circuit, and therefore it becomes possible to provide a very practical quantum circuit.

The present invention which has been described above may be applied to a system comprising a plurality of computers, or to a specific computer within a system. The invention may also be applied to a case in which the objects of the invention are achieved by execution of programs by such a computer. The programs may be supplied from an external storage medium, which is also within the range of the invention.

The individual components shown in outline or designated by blocks in the drawings are all well known in the signal processing apparatus arts and their specific construction and operation are not critical to the operation or the best mode for carrying out the invention.

Although the present invention has been described in its preferred form with a certain degree of particularity, many apparently widely different embodiments of the invention can be made without departing from the spirit and scope thereof. It is to be understood that the invention is not limited to the specific embodiments thereof except as defined in the appended claims.

What is claimed is:

1. A computer implemented method for simulating a behavior of quanta discretely distributed on a time base to form a signal to be generated in a signal processing apparatus for causing the signal to branch into a plurality of branch circuits, the method comprising the steps of:
   generating a simulated input signal containing signal patterns each representing a respective one of quanta in a signal to be input to the signal processing apparatus;
   allocating one of the branch circuits to each of the signal patterns generated in said generating step so that the ratio of the numbers of signal patterns to which the respective branch circuits are allocated equals a predetermined branching ratio; and
   generating simulated branched signals representing signals to be input to the respective branch circuits by dividing the signal patterns generated in said generating step among the branch circuits based on the allocation in said allocating step.

2. A method according to claim 1, further comprising the step of determining the predetermined branching ratio based on driving conditions of circuits provided at the respective branch circuits.

3. A method according to claim 2, wherein each branch circuit comprises an electronic circuit, and wherein the driving conditions include potential difference and impedance at each of the branch circuits.

4. A method according to claim 2, wherein each branch circuit comprises an optical circuit, and wherein the driving conditions include the circuit structure and optical characteristics in the vicinity of a branch point.

5. A method according to claim 1, further comprising the step of evaluating the branched signals generated in said second generating step.

6. A method according to claim 5, wherein said evaluating step judges if a signal obtained by adding predetermined quantum noise to the branched signals generated in said second generating step can be discriminated.

7. A method according to claim 6, wherein said first generating step generates the input signals having different intensity values, and wherein said evaluating step performs the judgment for the branched signals corresponding to the input signals.

8. A method according to claim 7, wherein said evaluating step determines the intensity of the signal to be input based on the result of the judgment.

9. A method according to claim 1, wherein the predetermined branching ratio is set to branch into equal parts, and wherein said allocating step cyclically allocates the respective branch circuits to the signal patterns with a predetermined order.

10. A method according to claim 1, wherein said allocating step comprises the steps of:
    generating random numbers within a predetermined range of values;
    assigning the random numbers generated in said random-number generating step to the respective signal patterns; and
    determining respective ones of the branch circuits for the signal patterns by comparing the random numbers assigned to the respective signal patterns in said assigning step with a predetermined reference value,
    wherein the respective one of the branch circuits determined for the signal patterns by said determining step are allocated to the quantum pattern data.

11. A method according to claim 10, wherein the reference value comprises boundary values for dividing the predetermined range of values into sub ranges with the same ratio as the branching ratio so that each sub range corresponds to the respective one of the branch circuits.

12. A method according to claim 10, wherein the random numbers consist of discrete values each corresponding to respective ones of the branch circuits, wherein the predetermined reference value includes at least one of the random numbers, and wherein said determining step compares the assigned random numbers with each of the discrete values to find coincidence.

13. A computer system for simulating a behavior of quanta discretely distributed on a time base to form a signal to be generated in a signal processing apparatus for causing the signal to branch into a plurality of branch circuits, the system comprising:
    first generation means for generating a simulated input signal containing signal patterns each representing a respective one of quanta in a signal to be input to the signal processing apparatus;
    allocation means for allocating one of the branch circuits to each of the signal patterns generated by said first generation means so that the ratio of the numbers of signal patterns to which the respective branch circuits are allocated equals a predetermined branching ratio; and
    second generation means for generating simulated branched signals representing signals to be input to the respective branch circuits by dividing the signal patterns generated by said first generation means among the branch circuits based on the allocation by said allocation means.

14. A system according to claim 13, wherein said allocating means comprises:
    random number generation means for generating random numbers within a predetermined range of values;
    assigning means for assigning the random numbers generated by said random number generating means to the respective signal patterns; and
    determining means for determining respective ones of the branch circuits for the signal patterns by comparing the random numbers assigned to the respective signal patterns by said assigning means with a predetermined reference value,
    wherein the respective one of the branch circuits determined for each signal pattern by said determining means are allocated to the signal patterns.

15. A computer readable storage medium storing a program for controlling a computer to simulate a behavior of quanta discretely distributed on a time base to form a signal to be generated in a signal processing apparatus for causing the signal to branch into a plurality of branch circuits, said program comprising codes for causing the computer to perform the steps of:

generating a simulated input signal containing signal patterns each representing a respective one of quanta in a signal to be input to the signal processing apparatus;

allocating one of the branch circuits to each of the signal patterns generated in said generating step so that the ratio of the numbers of signal patterns to which the respective branch circuits are allocated equals a predetermined branching ratio; and generating simulated branched signals representing signals to be input to the respective branch circuits by dividing the signal patterns generated in said generating step among the branch circuits based on the allocation in said allocating step.

16. A computer readable storage medium according to claim 15, wherein said allocating step comprises the steps of:

generating random numbers within a predetermined range of values;

assigning the random numbers generated in said random number generating step to the respective signal patterns; and determining a respective one of the branch circuits for the signal patterns by comparing the random numbers assigned to the respective signal patterns in said assigning step with a predetermined reference value, wherein the respective one of the branch circuits determined for the signal patterns by said determining step are allocated to the signal patterns.

* * * * *

UNITED STATES PATENT AND TRADEMARK OFFICE
CERTIFICATE OF CORRECTION

PATENT NO. : 6,321,182 B1
DATED : November 20, 2001
INVENTOR(S) : Takashi Suzuki It is certified that error appears in the above-identified patent and that said Letters Patent is hereby corrected as shown below:

Column 1,
Line 60, "should be enter" should read -- should enter --.

Column 3,
Line 62, "Shrödinger's" should read -- Schrödinger's --.

Column 4,
Line 50, "Heidelgerg," should read -- Heidelberg, --.

Column 5,
Line 25, "Bloglie" should read -- Broglie --.
Line 64, "(k • r - $\tilde{\omega}$ t)" should read --(k •$\tau$ - $\tilde{\omega}$ t)--.

Column 6,
Line 2, "(k • r - $\tilde{\omega}$ t)" should read --(k •$\tau$ - $\tilde{\omega}$ t)--.
Line 59, "Bloglie's" should read -- Broglie's --.

Column 7,
Line 3, "quantium" should read -- quantum --.
Line 13, "one of the axioms" should read -- one of the axioms of --.
Line 14, "frameworks" should read -- frameworks of --.
Line 27, "consisted" should read -- consisting --.

Column 8,
Line 49, "if" should be deleted.

Column 10,
Line 38, "remained" should read -- remaining --.
Line 52, "driving" should read -- deriving --.
Line 55, "from" should read -- for --.

Column 11,
Line 20, "out" should read -- out to be --.
Line 25, "Σ" should read -- Σ' --.
Line 39, "bellow." should read -- below. --.
Line 41, "with;" should read -- with --.
Line 53, "reat" should read -- rest --.

UNITED STATES PATENT AND TRADEMARK OFFICE
CERTIFICATE OF CORRECTION

PATENT NO. : 6,321,182 B1
DATED : November 20, 2001
INVENTOR(S) : Takashi Suzuki It is certified that error appears in the above-identified patent and that said Letters Patent is hereby corrected as shown below:

Column 12,
Line 27, "$\psi_1 = C_1 \exp i [\kappa_1 \bullet (\tau_1 \bullet$" should read -- $\psi_1' = C_1 \exp i [\kappa_1 \bullet (\tau_{1'}$ --.
Line 52, "in" should be deleted.
Line 54, "slits" should read -- slit --.

Column 13,
Line 15, "naturally occur" should read -- there naturally occurs --.
Line 28, "instance" should read -- instant --.
Line 33, "Shrodinger's" should read -- Schrödinger's --.
Line 47, "part" should read -- parts --.

Column 14,
Line 1, "dx" should read -- $d\chi$ --.
Line 62, "placed" should read -- placed from --.

Column 15,
Line 40, "revises" should read -- revised --.
Line 55, "exists" should read -- exist --.
Line 63, "Bohm's" should read -- Bohr's --.
Line 65, "same" should read -- some --.

Column 16,
Line 30, "construded" should read -- construed --.
Line 47, "$\psi_-$" should read -- $\psi_{-+}$ --.
Line 56, "instance" should read -- instant --.

Column 18,
Line 2, "obstacles" should read -- an obstacle --.
Line 57, "quantumpulse-" should read -- quantum-pulse- --.

UNITED STATES PATENT AND TRADEMARK OFFICE
CERTIFICATE OF CORRECTION

PATENT NO.    : 6,321,182 B1
DATED         : November 20, 2001
INVENTOR(S)   : Takashi Suzuki It is certified that error appears in the above-identified patent and that said Letters Patent is hereby corrected as shown below:

<u>Column 19,</u>
Line 19, "unique" should be deleted.

Signed and Sealed this

Fifteenth Day of October, 2002

*Attest:*

*Attesting Officer*

JAMES E. ROGAN
*Director of the United States Patent and Trademark Office*